(12) United States Patent
Sun

(10) Patent No.: US 7,371,108 B2
(45) Date of Patent: May 13, 2008

(54) PRINTED CIRCUIT BOARD HAVING BATTERY HOLDER

(75) Inventor: Zheng-Heng Sun, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/309,770

(22) Filed: Sep. 22, 2006

(65) Prior Publication Data

US 2007/0223317 A1 Sep. 27, 2007

(30) Foreign Application Priority Data

Mar. 25, 2006 (CN) .................. 2006 1 0034745

(51) Int. Cl.
*H01R 3/00* (2006.01)
(52) U.S. Cl. ..................................... 439/500
(58) Field of Classification Search ............... 439/500, 439/504, 73, 627, 754, 759, 775; 235/492; 361/760, 761
See application file for complete search history.

(56) References Cited

U.S. PATENT DOCUMENTS

| | | | | |
|---|---|---|---|---|
| 4,998,888 | A * | 3/1991 | Link et al. | 439/73 |
| 5,119,269 | A * | 6/1992 | Nakayama | 361/820 |
| 6,722,916 | B2 * | 4/2004 | Buccinna et al. | 439/500 |
| 7,238,045 | B1 * | 7/2007 | Chang | 439/500 |

* cited by examiner

*Primary Examiner*—Chandrika Prasad
(74) *Attorney, Agent, or Firm*—Wei Te Chung

(57) ABSTRACT

A printed circuit board includes a board, an electronic component mounted on the board, and a battery holder for holding a battery that has a positive pole and a negative pole. The battery holder includes a housing, and two contacts assembled to the housing and respectively electrically connected to the positive pole and the negative pole. The housing includes a base plate, and at least one support extending down from the base plate. A bottom of the at least one support abuts against a top surface of the board. An end of each of the two contacts is electrically connected to the board. The base plate defines an opening over the electronic component.

20 Claims, 4 Drawing Sheets

PRINTED CIRCUIT BOARD HAVING BATTERY HOLDER

FIELD OF THE INVENTION

The present invention relates to printed circuit boards (PCBs), and more particularly to a PCB having a battery holder.

DESCRIPTION OF RELATED ART

A conventional battery holder for a coin cell battery includes a housing and two contacts assembled to the housing. The housing includes a base plate and a sidewall extending up from a side of the base plate. The base plate and the sidewall together define a receiving cavity for receiving the coin cell battery. One of the two contacts connects with a negative pole of the coin cell battery. The other of the two contacts is connected to a positive pole of the coin cell battery.

When the battery holder is mounted on a PCB, a bottom of the battery holder abuts against a top surface of the PCB. Thus, an area of the PCB under the battery holder cannot be used for mounting of other electronic components.

What is desired, therefore, is a PCB having a battery holder, which has a space under the battery holder for mounting electronic components.

SUMMARY OF THE INVENTION

In one preferred embodiment, a printed circuit board includes a board, an electronic component mounted on the board, and a battery holder for holding a battery that has a positive pole and a negative pole. The battery holder includes a housing, and two contacts assembled to the housing and respectively connected to the positive pole and the negative pole. The housing includes a base plate, and at least one support extending down from the base plate. A bottom of the at least one support abuts against a top surface of the board. An end of each of the two contacts is electrically connected to the board. The base plate defines an opening over the electronic component.

Other advantages and novel features will bercome more apparent from the following detailed description of preferred embodiments when taken in conjunction with the accompanying drawings, in which:

DETAILED DESCRIPTION OF THE INVENTION

Figure 1:
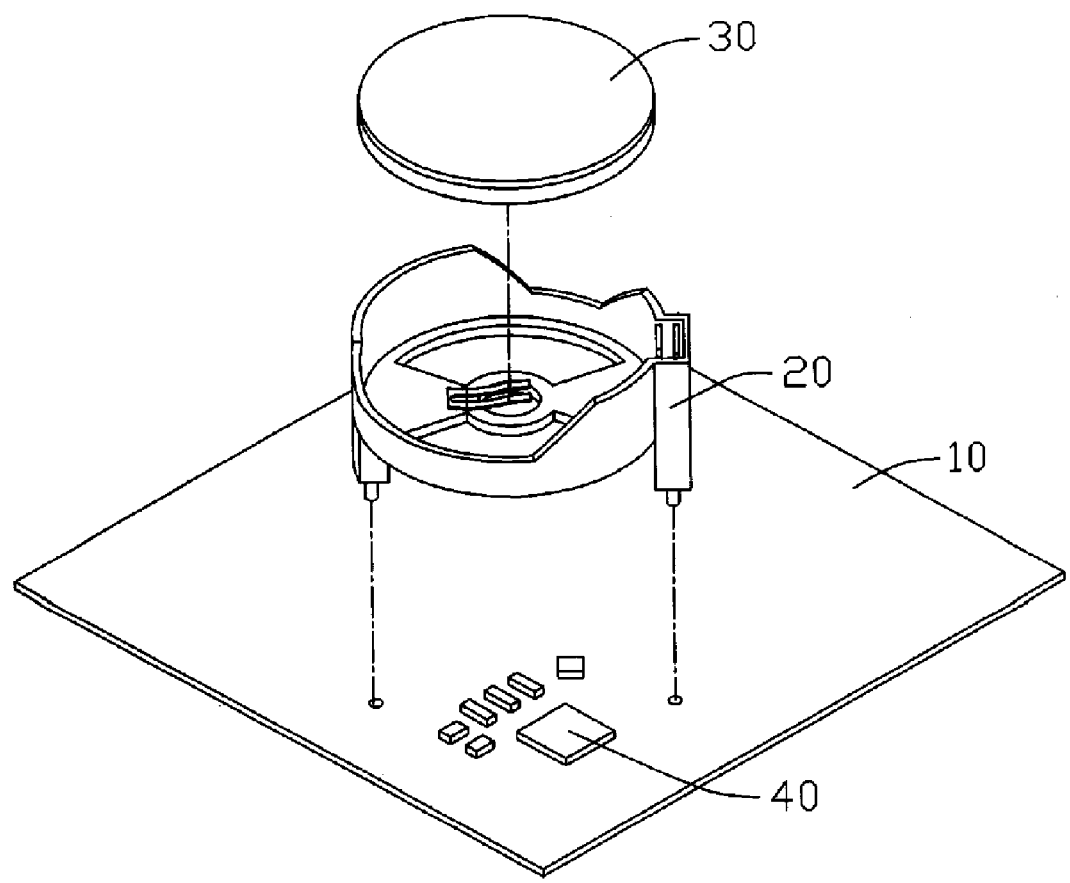
FIG. 1 is an exploded, isometric view of a printed circuit board having a battery holder, in accordance with a preferred embodiment of the present invention.

Referring to FIG. 1, a printed circuit board (PCB) in accordance with the present invention includes a board 10, a battery holder 20, a coin cell battery 30, and a plurality of electronic components 40 mounted on the board 10. The electronic components 40 are small surface mounted components.

Figure 2:
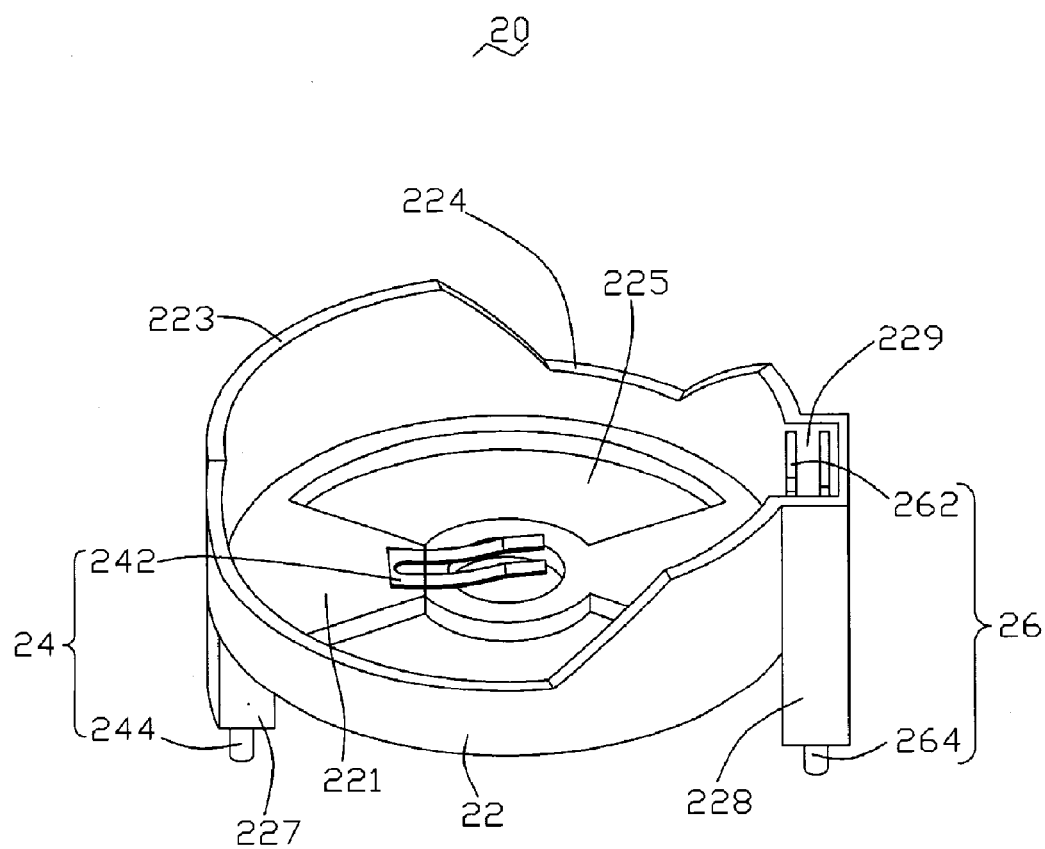
FIG. 2 is an enlarged, isometric view of the battery holder of FIG. 1.
Figure 3:
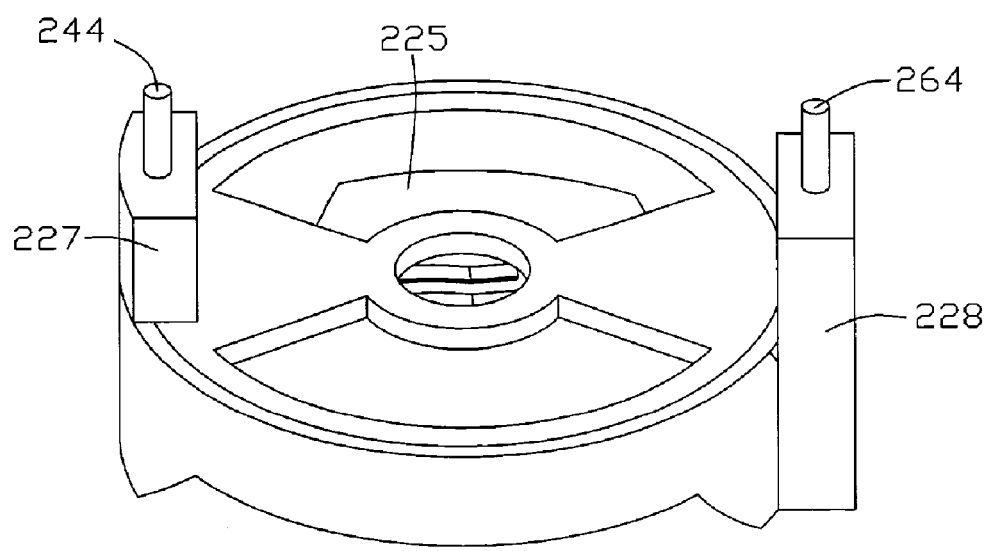
FIG. 3 is similar to FIG. 2, but an inverted view.

Referring to FIGS. 2 and 3, the battery holder 20 includes a housing 22, a first contact 24, and a second contact 26. The first and second contacts 24, 26 are assembled to the housing 22.

The housing 22 includes a substantially coin-shaped base plate 221, a sidewall 223 extending up from a side of the base plate 221, a first support 227, and a second support 228. The base plate 221 and the sidewall 223 together define a receiving cavity for receiving the coin cell battery 30. The first support 227 extends down from the base plate 221 adjacent the side of the base plate 221. The second support 228 is formed opposite to the first support 227 on the side of the base plate 221. A groove 229 communicating with the receiving cavity is defined in an upper portion of the second support 228. Two cutouts 224 are defined in the sidewall 223, opposite to each other for convenient insertion or removal of the coin cell battery 30 into/from the receiving cavity. Two openings 225 are symmetrically defined in the base plate 221. The two openings 225 may be arc-shaped, rectangular, and so on.

The first contact 24 includes a retention arm 242 and an inserting arm 244 electrically connected to the retention arm 242. The retention arm 242 is retained on a middle area of a top surface of the base plate 221. The inserting arm 244 is inserted through the support 227 then extends down from a bottom of the first support 227. Similarly, the second contact 26 includes a retention arm 262 and an inserting arm 264 electrically connected to the retention 262. The retention arm 262 is located in the groove 229 of the second support 228. The inserting arm 264 is inserted through the support 228 then extends out from a bottom of the second support 228.

Figure 4:
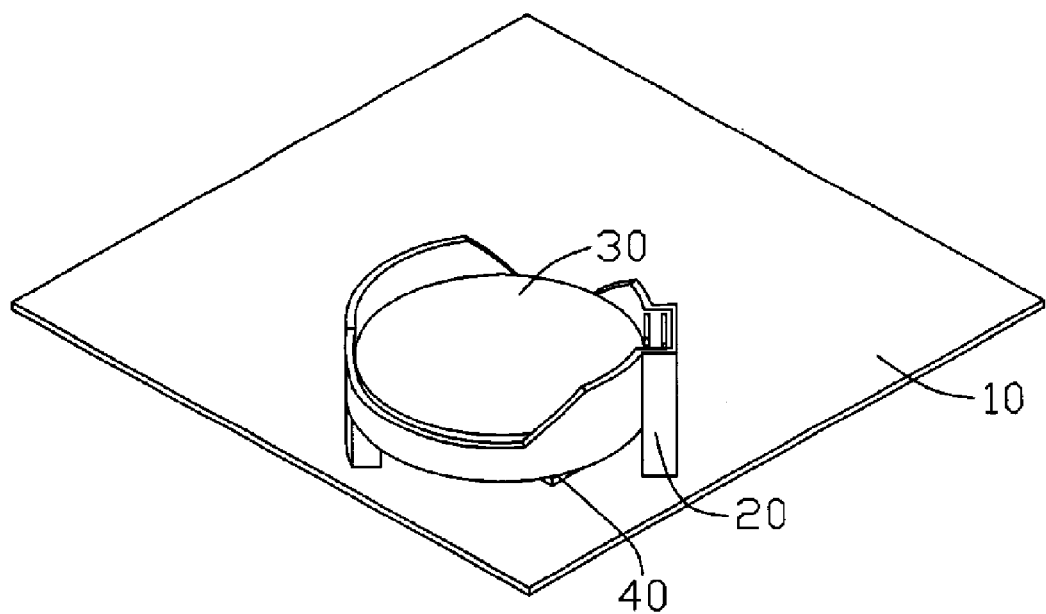
FIG. 4 is an assembled view of FIG. 1.

Referring to FIG. 4, in assembling the battery holder 20 to the board 10, the inserting arm 244 of the first contact 24 and the inserting arm 264 of the second contact 26 are electrically connected to the board 10 such that the base plate 221 is located over the electronic components 40. Bottoms of the first support 227 and the second support 228 abut against a top surface of the board 10. A diameter of the coin cell battery 30 is substantially equal to or a little smaller than that of the receiving cavity of the battery holder 20. In assembling the coin cell battery 30 to the battery holder 20, the coin cell battery 30 is placed into the receiving cavity of the housing 22. A positive pole of the coin cell battery 30 contacts with the retention arm 242 of the first contact 24, and a negative pole of the coin cell battery 30 abuts against the retention arm 262 of the second contact 26. Therefore, the coin cell battery 30 is fully received in the receiving cavity with the positive pole thereof electrically connecting with the inserting arm 244 of the first contact 24, and the negative pole thereof electrically connected with the inserting arm 264 of the second contact 26. That is to say, the coin cell battery 30 is electrically connected to the board 10.

Because the battery holder 20 has the first support 227 and the second support 228 extending down from the base plate 221, there is a space to mount the electronic components 40 on the board 10 under the battery holder 20. Additionally, because the battery holder 20 has two openings 225, users can see marks of the electronic components 40 through the two openings 225 after taking out the coin cell battery 30 from the battery holder 20. Thus, the users can distinguish the electronic components 40. It is to be noted that although coin-shaped batteries are a standard in the industry that the battery holder may be configured for other-shaped batteries that may be developed in the future.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A printed circuit board (PCB), comprising:
   a circuit board;
   a surface mounted component mounted on the circuit board; and
   a battery holder for holding a battery that has a positive pole and a negative pole, comprising a housing, and two contacts assembled to the housing and respectively electrically connected to the positive pole and the negative pole, the housing comprising a base plate for supporting the battery thereon, and at least one support extending down from the base plate, a bottom of the at least one support abutting against and supported on a top surface of the circuit board, an end of each of the two contacts electrically connected to the circuit board, the base plate defining an opening over the surface mounted component to expose the surface mounted component through the opening after taking out the battery from the battery holder.

2. The PCB as claimed in claim 1, wherein the at least one support comprises a first support and a second support, each of the two contacts comprises an inserting arm, each of the inserting arms is inserted through a corresponding support of the first support and the second support and extends out from the support.

3. The PCB as claimed in claim 2, wherein the housing further comprises a sidewall extending up from a side of the base plate, the base plate and the sidewall together define a receiving cavity for receiving the battery.

4. The PCB as claimed in claim 3, wherein two cutouts are defined in the sidewall for convenient insertion or removal of the battery into or from the receiving cavity of the battery holder.

5. The PCB as claimed in claim 3, wherein the first support extends down from a bottom of the base plate, the second support is formed apposite to the first support on the side of the base plate.

6. The PCB as claimed in claim 5, wherein an upper of the second support defines a groove communicating with the cavity, and another end of one of the two contacts is located in the groove.

7. The PCB as claimed in claim 6, wherein another end of the other of the two contacts is assembled an a middle area of the base plate.

8. The PCB as claimed in claim 1, wherein two holes are defined in the circuit board, the surface mounted component is located between and spaced from the two holes of the circuit board, said end of each of the two contacts is inserted in a corresponding one of the two holes.

9. The PCB as chimed in claim 1, wherein the base plate further defines another opening over the surface mounted component to expose the surface mounted component through the another opening, the opening and the another opening are symmetrically defined in the base plate along an extending line of one of the two contacts.

10. A battery holder for a battery that has a positive pole and a negative pole, the battery holder configured for connecting a printed circuit board (PCB) and supplying power to the PCB via the battery, the PCB comprising a pair of holes defined therein and a surface mounted component mounted thereon and between the holes, the batten holder comprising:
    a housing comprising a base plate, a first support, and a second support, the first support and the second support extending down from the base plate and configured to be supported on a top surface of the PCB around the holes respectively, the base plate defining an opening over the surface mounted component to expose the surface mounted component through the opening after taking out the battery from the battery holder; and
    two contacts assembled to the housing, each of the two contacts comprising an inserting arm, each inserting arm inserted through a corresponding support of the first support and the second support then extending out from a bottom of the support to be inserted in the holes of the PCB.

11. The battery holder as claimed in claim 10, wherein the housing comprises a sidewall extending up from a side of the base plate, the base plate and the sidewall together define a receiving cavity for receiving the battery.

12. The battery holder as claimed in claim 11, wherein a cutout is defined in the sidewall for convenient insertion or removal of the battery into or from the receiving cavity of the battery holder.

13. The battery holder as claimed in claim 11, wherein the first support extends down from a bottom of the base plate, the second support is formed opposite to the first support on the side of the base plate.

14. The battery holder as claimed in claim 13, wherein a groove communicating with the cavity is defined in an upper portion of the second support, another end of one of the two contacts is located in the groove.

15. The battery holder as claimed in claim 14, wherein another end of the other of the two contacts is assembled on a middle area of the base plate.

16. The battery holder as claimed in claim 10, wherein one of the two contacts comprises an arm for being electrically connected to a corresponding one of the positive pole and the negative pole, the arm is entirely located inside the corresponding support of the first support and the second support for the one of the two contacts.

17. A printed circuit board (PCB), comprising:
    a board comprising a pair of holes defined therein;
    a surface mounted component mounted on the board and between the holes; and
    a battery holder for holding a battery that has a positive pole and a negative pole, comprising a housing for holding the battery therein, and two contacts installed to the housing for respectively electrically connecting the positive pole and the negative pole with the board, each of the two contacts inserted in a corresponding one of the two holes, at least one support extending down from the housing, one lower end portion of the at least one support being attached to the board adjacent to the surface mounted component to thereby support the housing above the surface mounted component the housings defining an opening over the surface mounted component to expose the surface mounted component through the opening after taking out the battery from the battery holder.

18. The PCB as claimed in claim 17, wherein the housing comprises a base plate and a sidewall extending up from a periphery of the base plate, the base plate and the sidewall together defining a receiving cavity for receiving the battery, the opening is defined in the base plate.

19. The PCB as claimed in claim 18, wherein the at least one support comprises a pair of supports provided at opposite sides of the base plate and extending downward from the periphery of the base plate.

20. The PCB as claimed in claim 19, wherein one of the supports defines a groove at an upper end portion thereof, the groove communicating with the cavity and receiving one of the contacts.

\* \* \* \* \*